(12) United States Patent
Tonomura et al.

(10) Patent No.: US 6,728,432 B1
(45) Date of Patent: Apr. 27, 2004

(54) HIGHLY ADAPTABLE HETEROGENEOUS POWER AMPLIFIER IC MICRO-SYSTEMS USING FLIP CHIP AND MICROMECHANICAL TECHNOLOGIES ON LOW LOSS SUBSTRATES

(75) Inventors: Samuel D. Tonomura, Rancho Palos Verdes, CA (US); Robert C. Allison, Rancho Palos Verdes, CA (US); Brian M. Pierce, Moreno Valley, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 10/294,518

(22) Filed: Nov. 13, 2002

(51) Int. Cl.$^7$ ................................. G02B 6/12
(52) U.S. Cl. ....................................... 385/14
(58) Field of Search ..................... 385/14; 438/53, 438/108

(56) References Cited

U.S. PATENT DOCUMENTS

| | | | | |
|---|---|---|---|---|
| 5,719,073 A | * | 2/1998 | Shaw et al. | 438/53 |
| 5,761,350 A | * | 6/1998 | Koh | 385/14 |
| 6,607,934 B2 | * | 8/2003 | Chang et al. | 438/50 |

* cited by examiner

Primary Examiner—Ellen E. Kim
(74) Attorney, Agent, or Firm—Leonard A. Alkov; Glenn H. Lenzen, Jr.

(57) ABSTRACT

A first MEM is mounted on a substrate having a first contact and a second contact is mounted on a substrate. A PA power cell is thermally connected to the substrate using a thermal bump. The power cell is electrically insulated from the substrate. The power cell has a first power cell bump and a second power cell bump as pathways for I/O functions. A first insulator is mounted on the substrate supporting a second MEM above the substrate. The second MEM has a first connection and a second connection The first connection and the second connection are located on a bottom surface of the second MEM. A first conductive via vertically traverses the first insulator and is connected to the first connection from the second MEM. This first conductive via is further connected to a first conductor. The first conductor is insulated from substrate by a first insulating layer. The first conductor is further connected to the first power cell bump. A second conductor is insulated from the substrate by a second insulating layer. The second conductor is connected to a second conductive via. The second conductive via traverses vertically a second insulator. The second conductive via is connected to a first metal member. The first metal member is formed over the upper surface of the second insulator and connected to a first input to the first MEM switch. A second metal member is connected to the second contact of the first MEM switch. The second metal member is formed over the upper surface of a third insulator. The third insulator is positioned over the substrate.

8 Claims, 4 Drawing Sheets

HIGHLY ADAPTABLE HETEROGENEOUS POWER AMPLIFIER IC MICRO-SYSTEMS USING FLIP CHIP AND MICROMECHANICAL TECHNOLOGIES ON LOW LOSS SUBSTRATES

BACKGROUND OF THE INVENTION

1. Field of Invention

This invention is in the field of re-configurable hybrid assemblies on low loss substrates.

2. Description of the Related Art

Monolithic Integrated Circuits (MMIC) technology is a technology supporting many of the present generation of military and commercial radio frequency sensors and communication applications. MMICs include active devices, such as Field Effect Transistors and bipolar transistors, passive elements such as MIM capacitors, thin film and bulk resistors and inductors integrated on a single semi-insulating Gallium Arsenide substrate. Circuit performance and topology is generally fixed at the time of manufacture, typically using "static" impedance matching networks to interconnect various elements. This static approach limits a circuit to a single function, precludes its re-configuration, restricts its use for new modes, functions, operations and band-width. This inability to adapt to new configurations in real time to new requirements limits system performance, decreases system mean time between failure as well as useful operating lifetime, and flexibility.

Micro-Electro-Mechanical Systems (MEMS) is the integration of mechanical elements, sensors, actuators, and electronics on a common substrate through the utilization of microfabrication technology. While typical electronics elements such as transistors are fabricated using integrated circuit (IC) process sequences (e.g., CMOS, Bipolar, or BICMOS processes), micromechanical MEMS structures are fabricated using process compatible micromachining processes that selectively etch away parts of the silicon wafer or add new structural layers to form the mechanical and electromechanical devices.

An example of a MEMS structure having a bidirectional rotating member having two positions is described in U.S. Pat. No. 6,072,686, incorporated herein by reference in its entirety.

Another example of a MEMS structure for microwave (millimeter wave) applications is described in U.S. Pat. No. 6,046,659, incorporated herein by reference in its entirety.

SUMMARY OF THE INVENTION

A first MEM 329 having a first contact and a second contact is mounted on a substrate 301. A PA power cell 325 is thermally connected to the same substrate 301 using a thermal bump 321. The power cell 325 is electrically insulated from the substrate 301. The power cell 325 has a first power cell bump 311 and a second power cell bump 309 as pathways for I/O functions.

A first insulator 319 is mounted on substrate 301 supporting a second MEM 327 above the substrate 301. The second MEM 327 has a first connection 315 and a second connection 317. The first connection and the second connection are located on a bottom surface of the second MEM 327.

A first conductive via 313 vertically traverses the first insulator 319 and is connected to the first connection 315 from the second MEM 327. This first conductive via 313 is further connected to a first conductor 337. The first conductor is insulated from substrate 301 by a first insulating layer 333. The first conductor 337 is further connected to the first power cell bump 311.

A second conductor 335 is insulated from the substrate 301 by a second insulating layer 331. The second conductor 335 is connected to a second conductive via 307. The second conductive via 307 traverses vertically a second insulator 339. The second conductive via 307 is connected to a first metal member 305. The first metal member 305 is formed over the upper surface of the second insulator 339 and connected to a first input to the first MEM switch 329.

A second metal member 303 is connected to the second contact of the first MEM switch 329. The second metal member is formed over the upper surface of a third insulator 323. The third insulator 323 is positioned over substrate 301.

DETAILED DESCRIPTION

This invention introduces the notion of using MEMS switches to reconfigure the topology of radio frequency matching network components to achieve added functions and characteristics. The approach for reducing the attenuation or non-linearity of switching elements of the prior art is to use MEMS type structures having low insertion loss to perform the switching function.

Figure 1:
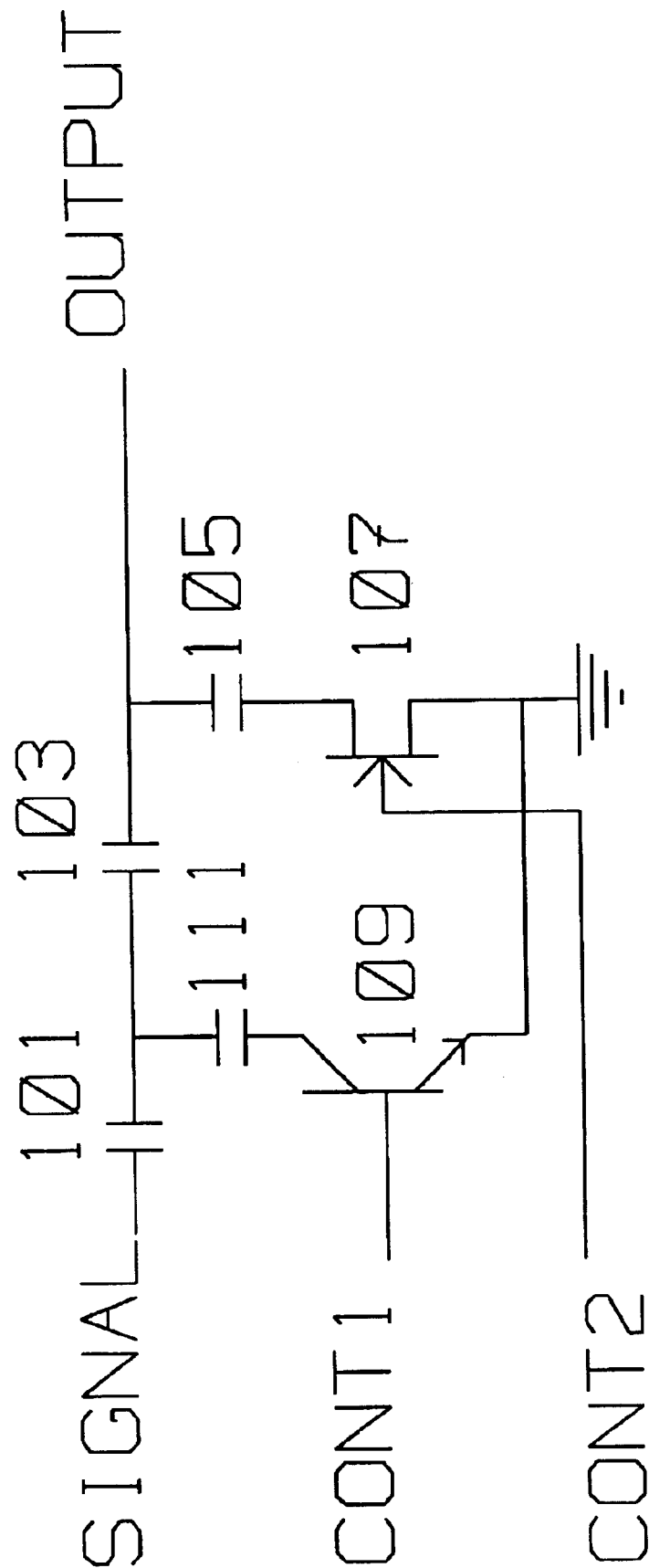
FIG. 1 is an exemplary network of the prior art presenting a variable impedance varied using non-linearities in transistors.

As shown in FIG. 1, in the prior art, field effect transistors or bipolar transistors were biased in various ways to present a change in impedance presented by the network at various operating points of the transistors. For example, a signal applied to the input of capacitor 101 could be shunted to ground using capacitor 111 and bipolar transistor 109. The remaining signal passes through capacitor 103 towards the output. A change in impedance to the signal can be commanded by activating transistor 109. Similarly, capacitor 105 can be shunted to ground on command from control CONT2. Thus, as shown in FIG. 1, in the prior art, by changing the bias point of either transistor 109 or FET 107, the impedance between signal input and ground can be changed. Furthermore, the bias point of transistor 109 can be selectively chosen to change the impedance seen by capacitor 111 to ground. With transistor 109 not in saturation, capacitor 111 sees a current sink to ground, the current sink value determined by the bias current applied to control CONT1. Similarly, control CONT2 for FET 107 depending on voltage value, controls the characteristic of FET 107 connecting capacitor 105 to ground. In a digital environment transistors 109 and 107 could be full ON or "OFF". In an analog environment, transistors 109 and 107 can be viewed as variable elements.

Transistors 107 and 109 are however less than ideal for the application. When in saturation, transistor 109 has a $V_{ee}$ voltage across it, inducing losses. Similarly, FET 107, when in saturation still presents an resistive impedance between capacitor 105 and ground.

Figure 4:
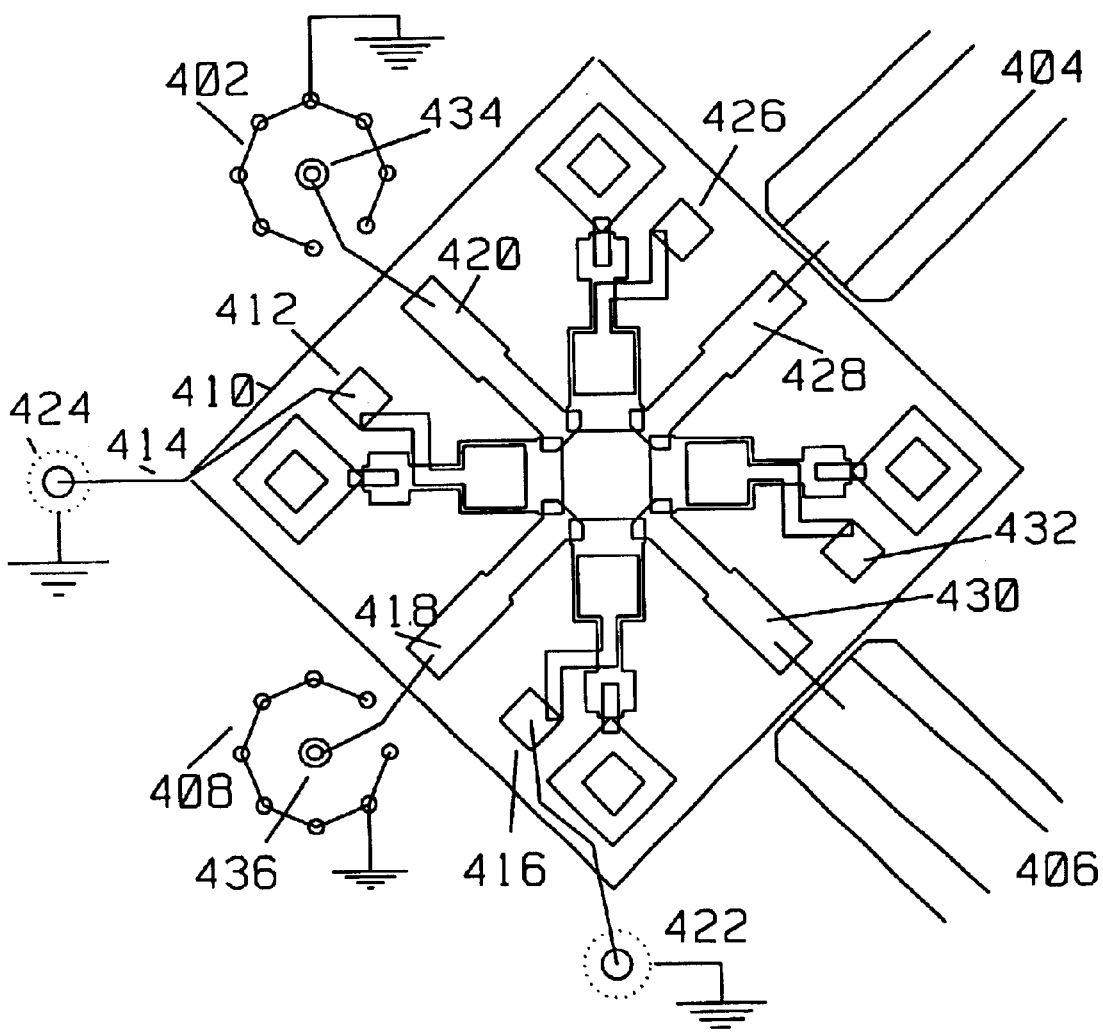
FIG. 4 is an exemplary layout of a MEM switch for use with the present invention.

This invention calls for the use of low capacitance and low ON resistance MEMS switches to reconfigure the matching networks used in high frequency circuits. These MEMS switches are used in conjunction with flip chip technology on a low loss substrate. A typical MEMS switch is shown in FIG. 4 and is described below with respect to FIG. 4.

Figure 2:
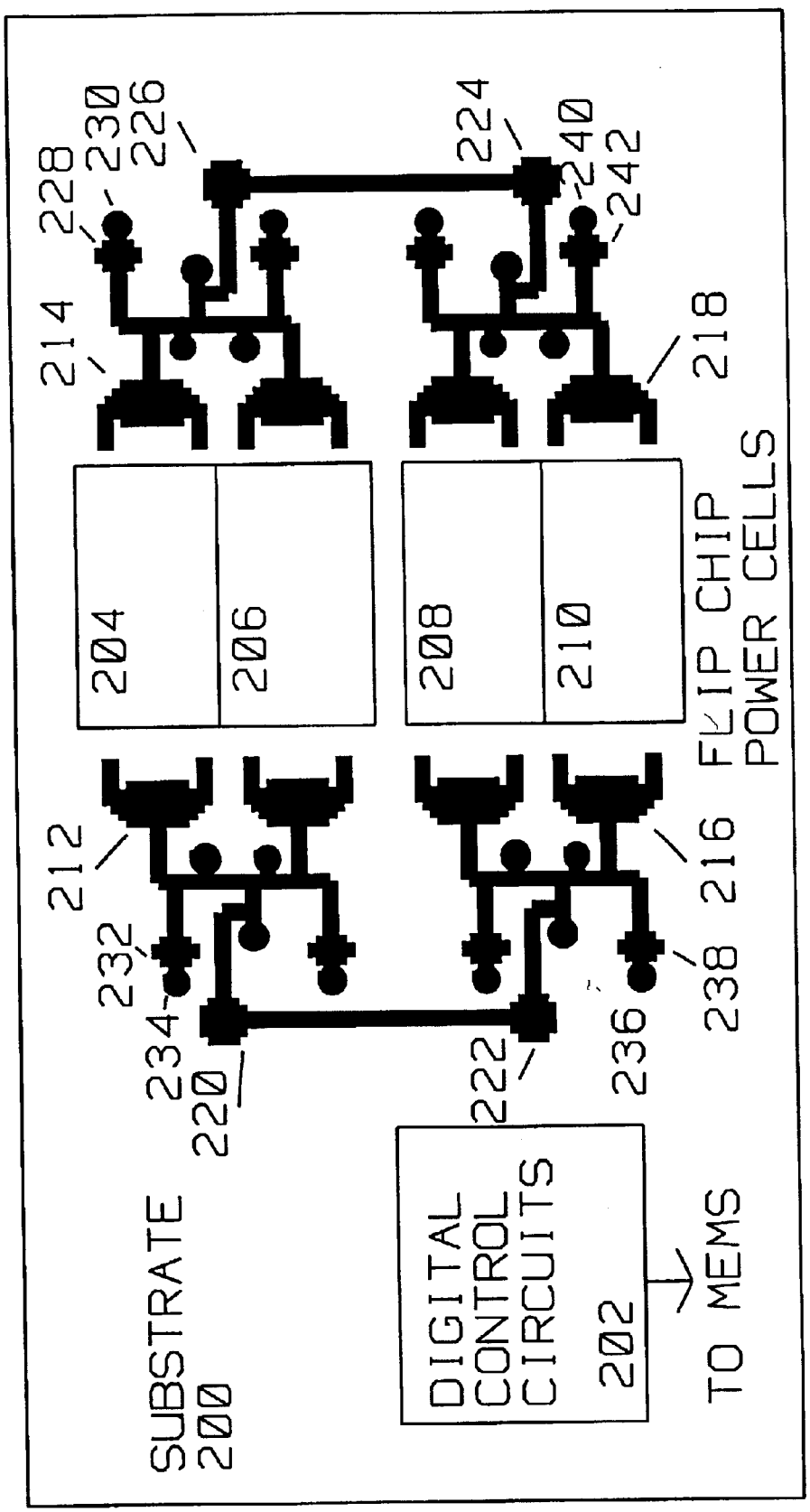
FIG. 2 is an exemplary network of the present invention for connecting matching networks to flip chip power cells using MEM switches.

FIG. 2 shows the use of MEM switches connecting matching networks to flip chip power cells. On substrate 200 are mounted digital control circuits 202 as well as Flip chip power cells 204, 206, 208 and 210.

MEM switch and matching network 212, 214, 216, 218 processes high frequency analog signals presented to the flip chip power cells. For example, MEM switch 220, connected to MEM switch 222 can route RF signals to various matching networks attached to contact pads such as contact pad 234.

Similarly, MEM switch 224 is connected to MEM switch 226 allowing signal routing. MEM switch 228 controls switches signals applied to or from contact pad 230.

In the same manner MEM switch 232 switches signals from contact pad 234. Another example is MEM switch 238 and contact pad 236. Yet another path is contact pad 240 signals routed using MEM switch 242.

Figure 3:
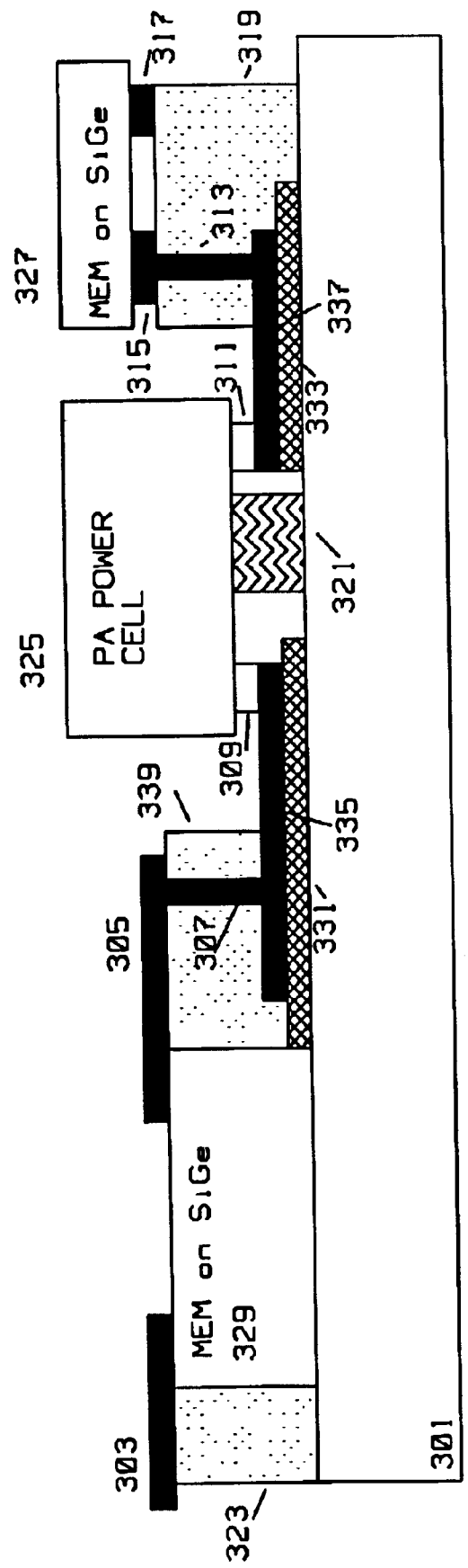
FIG. 3 is an exemplary vertical layout of the PA power cells and MEM switches over a substrate.

FIG. 3 shows the vertical crossection of the adaptable assembly described in FIG. 2. This assembly is for use at high frequencies and has a substrate 301, a first MEM 329 mounted on said substrate having a first contact and a second contact.

A PA power cell 325 is thermally connected to the substrate 301 using a thermal bump 321. The power cell 325 is electrically insulated from said substrate 301. The power cell 325 has a first power cell bump 311 and a second power cell bump 309 as pathways for I/O functions.

A first insulator 319 mounted on substrate 301 supporting a second MEM 327 above the substrate 301. The second MEM has a first connection 315 and a second connection 317. The first connection and the second connection are located on a bottom surface of the second MEM 327. The first and second connection are used for accessing the switching functions of MEM 327.

A first conductive via 313 vertically traverses the first insulator 319 and is connected to the first connection 315 from the second MEM 327. This first conductive via 313 is further connected to a first conductor 337. The first conductor is insulated from substrate 301 by a first insulating layer 333.

The first conductor 337 is further connected to the first power cell bump 311.

A second conductor 335 is insulated from the substrate 301 by a second in sulating layer 331. The second conductor 335 is connected to a second conductive via 307. The second conductive via 307 traverses vertically a second insulator 339. The second conductive via 307 is connected to a first metal member 305. The first metal member 305 is formed over the upper surface of the second insulator 339 and connected to a first input to the first MEM switch 329.

A second metal member 303 is connected to the second contact of the first MEM switch 329. The second metal member is formed over the upper surface of a third insulator 323. The third insulator 323 is positioned over substrate 301.

The first MEM and the second MEM are formed on a choice of substrates. Substrates are Gallium Arsenide, Silicon Germanium, Silicon on Insulator, or Silicon on Sapphire.

The first MEM is also connected to one or more matching networks. These networks are used for matching radio frequency power flowing out of and to the PA power cell 325.

The first metal member 305 or the second metal member 303 are formed as coplanar waveguide having a characteristic impedance suitable for the circuit at hand. Typically the impedance is 50 ohms.

FIG. 4 shows a MEM, a typical multilayer switching assembly for switching a high frequency signal using the principles of this invention. This assembly comprises a MEMS structure 410 on a SiGe substrate. The MEMS structure has a first terminal 420, a second terminal 428, a third terminal 430, and a fourth terminal 418. Also provided is a first control input 412, a second control input 416, a third control input 432, and a fourth control input 426. Using the MEMS structure 410, the high frequency signal presented to said first terminal 420 can be connected from said first terminal 420 to either said second terminal 428 or said fourth terminal 418 in response to a control signal applied to said first control input 412 and said second control input 416. Control terminal 412 is connected to control terminal 432 using a bond wire (bond wire not shown for clarity). Similarly control terminal 416 is connected to control terminal 426 using a bond wire. The control signal presented to 416 and 426 is always logically opposite to that presented to 432 and 412.

The MEMS structure 410 is formed on an upper surface of a substrate. A first descender 434, made of a conductive material, traverses the first insulating layer 319 and and is connected to (signal) conductor 337, as shown in FIG. 3. First descender 434 is also connected to first terminal 420.

First descender 434 is enveloped at a distance by a first conductive shield 402. This conductive shield 402 traverses vertically insulating layer 319 in the case of MEMS 327. For MEMS 329, a conductive shield traverses insulator 339.

Conductive shield 402 is typically connected to ground. Shield 402 is shown to be made of multiple conductive vias vertically traversing the insulating layer. These vias are arranged in a circular pattern, as exemplified in 402 and 408, thus forming the external sheath of a coaxial structure. The distance between descender 434 and shield 402 is chosen based on insulating material characteristics, for a specific impedance of the coaxial structure to be presented by said first descender to the high frequency signal. This impedance is typically 50 ohms at millimeter wave operating frequencies.

A first coplanar waveguide (CPW) 404 is connected to the second terminal 428. This coplanar waveguide is positioned on the upper surface 500 of the first insulating layer 510. The first coplanar waveguide presents the typical 50 ohm specific impedance to the high frequency signal.

Similarly, a second coplanar waveguide 406 is connected to the third terminal 430. This second coplanar waveguide is also positioned on the upper surface of insulating layer 339 or 323. The second coplanar waveguide also presents a 50 ohm specific impedance to the high frequency signal.

Control signals are delivered to first control 412 using a control conductor, not shown, typically from digital control circuits 202.

All references cited in this document are incorporated herein by reference in their entirety.

Although presented in exemplary fashion employing specific embodiments, the disclosed structures are not intended to be so limited. For example, while flip chip power cells are shown, the same principle can be applied to low power signals to be processed by an analog entity. For example, multiple RF signals can be routed to delay lines or A/D converters.

Those skilled in the art will also appreciate that numerous changes and modifications could be made to the embodiment described herein without departing in any way from the invention. These changes and modifications and all obvious variations of the disclosed embodiment are intended to be embraced by the claims to the limits set by law.

What is claimed is:

1. An adaptable assembly for use at high frequencies comprising:

a substrate;

a first MEM mounted on said substrate having a first contact and a second contact;

a power cell thermally connected to said substrate using a thermal bump, said power cell electrically insulated from said substrate; said power cell having a first power cell bump and a second power cell bump;

a first insulator mounted on said substrate supporting a second MEM above said substrate, said second MEM having a first connection and a second connection, said first connection and said second connection located on a bottom surface of said second MEM;

a first conductive via vertically traversing said first insulator and connected to said first connection from said second MEM;

said first conductive via further connected to a first conductor, said first cons ductor insulated from said substrate by a first insulating layer;

said first conductor further connected to said first power cell bump;

a second conductor insulated from said substrate by a second insulating layer, said second conductor connected to a second conductive via, said second conductive via traversing a second insulator, said second conductive via connected to a first metal member, said first metal member formed over the upper surface of said second insulator and connected to a first input to said first MEM switch;

a second metal member connected to said second contact of said first MEM switch said second metal member formed over the upper surface of a third insulator, said third insulator positioned over said substrate.

2. An adaptable assembly as described in claim 1 wherein said first MEM and said second MEM are formed on a substrate of Gallium Arsenide.

3. An adaptable assembly as described in claim 1 wherein said first MEM and said second MEM are formed on a substrate of Silicon Germanium.

4. An adaptable assembly as described in claim 1 wherein said first MEM and said second MEM are formed on a substrate of Silicon on Insulator.

5. An adaptable assembly as described in claim 1 wherein said first MEM and said second are formed on a substrate of Silicon on Sapphire.

6. An adaptable assembly as described in claim 1 wherein said first MEM is also connected to a matching network, said network used for matching radio frequency power flowing out of and said power cell.

7. An adaptable assembly as described in claim 1 wherein said first metal member is a co planar waveguide.

8. An adaptable assembly as described in claim 1 wherein said second metal member is a coplanar waveguide.

* * * * *